United States Patent

Celaya et al.

(10) Patent No.: US 7,638,863 B2
(45) Date of Patent: Dec. 29, 2009

(54) SEMICONDUCTOR PACKAGE AND METHOD THEREFOR

(75) Inventors: Phillip Celaya, Gilbert, AZ (US); James P. Letterman, Jr., Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 524 days.

(21) Appl. No.: 11/469,239

(22) Filed: Aug. 31, 2006

(65) Prior Publication Data

US 2008/0054424 A1   Mar. 6, 2008

(51) Int. Cl.
*H01L 23/02* (2006.01)

(52) U.S. Cl. .............................. 257/678; 257/E21.499; 257/E23.034; 438/106; 438/123; 438/612

(58) Field of Classification Search .......... 257/E21.499, 257/E23.034, 678; 438/106, 123, 612
See application file for complete search history.

(56) References Cited

U.S. PATENT DOCUMENTS

| 5,656,550 | A | 8/1997 | Tsuji et al. |
| 6,611,063 | B1 * | 8/2003 | Ichinose et al. ............. 257/784 |
| 6,964,888 | B2 * | 11/2005 | Bai ............................ 438/126 |
| 7,348,663 | B1 * | 3/2008 | Kirloskar et al. ............ 257/704 |
| 2005/0263864 | A1 | 12/2005 | Islam et al. |

* cited by examiner

*Primary Examiner*—Eugene Lee
*Assistant Examiner*—Peniel M Gumedzoe
(74) *Attorney, Agent, or Firm*—Robert F. Hightower

(57) ABSTRACT

In one embodiment, a semiconductor package is formed to include a tamper barrier that is positioned between at least a portion of the connection terminals of the semiconductor package and an edge of the semiconductor package.

14 Claims, 4 Drawing Sheets

SEMICONDUCTOR PACKAGE AND METHOD THEREFOR

BACKGROUND OF THE INVENTION

The present invention relates, in general, to semiconductor packages, and more particularly, to methods of forming semiconductor packages and structures therefor.

In the past, the semiconductor industry utilized various methods and structures to form packages to encapsulate and provide electrical connections to semiconductor die. Over many years, the configuration of the semiconductor package has evolved with a desire to provide smaller and smaller footprints for the semiconductor packages. In an effort to provide smaller packages, the industry developed various package styles including laminate type packages for example, packages referred to in general as Ball Grid Array (BGA) and Laminate Grid Array (LGA). Other packages styles that provided small footprints and were easy to manufacture included built-up type packages or plated-up type packages such as BCC and Etched Leadless Grid Array (ELGA) packages. An example of an etched leadless grid array (ELGA) type package is provided in United States patent publication number 2005/0263864 of Islam et al that was published on Dec. 1, 2005.

One problem with these prior packages was that once the package was assembled onto an underlying substrate, such as a printed circuit board or other equivalent, it was easy to externally insert an electrical probe between the underlying substrate and the semiconductor package and make electrical contact to the contact terminals on the semiconductor package. Because the contact terminals of the semiconductor package could be electrically probed, it was possible to electrically access the semiconductor die through the electrical probes and to access data that may be stored on the semiconductor die.

Other types of packages, such as those commonly refereed to as Quad Flat Pack (QFN), often had a portion of a lead terminal that was exposed along the side of the package. Such packages could be easily probed to obtain access to information stored in the semiconductor die that was encapsulated within the package.

Accordingly, it is desirable to have a semiconductor package that more securely protects an encapsulated semiconductor die from being electrically probed.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor.

DETAILED DESCRIPTION OF THE DRAWINGS

Figure 1:
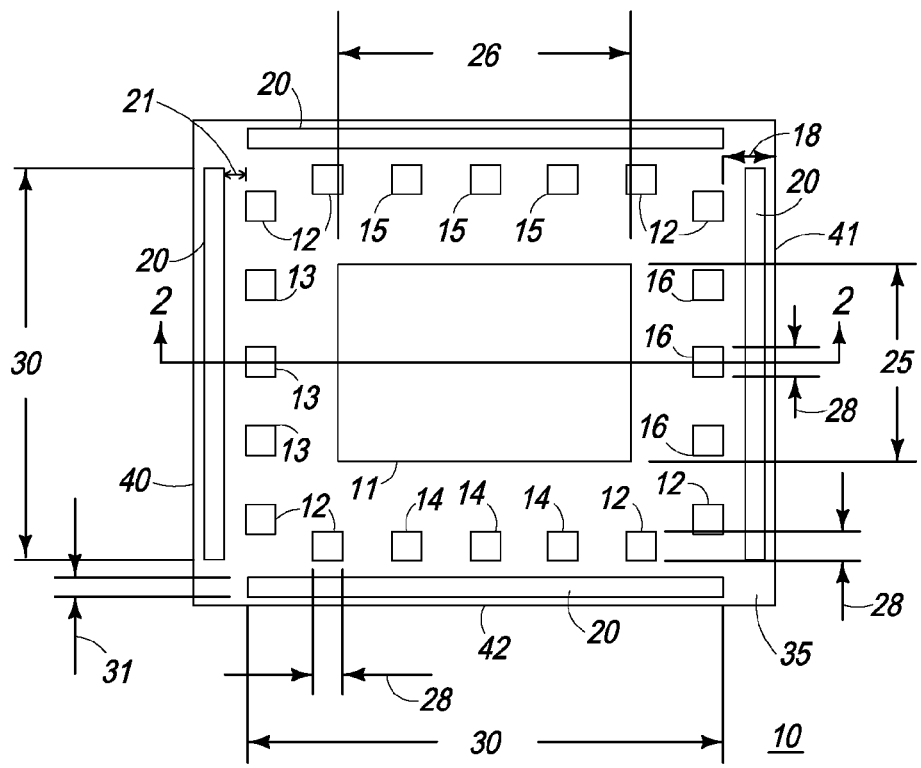
FIG. 1 illustrates an enlarged bottom plan view of a portion of an embodiment of a semiconductor package in accordance with the present invention.

FIG. 1 illustrates an enlarged bottom plan view of a portion of an embodiment of a semiconductor package 10 that includes tamper barriers 20. As will be seen further hereinafter, tamper barriers 20 substantially prevent electrically probing some of the contact terminals of package 10 after package 10 is assembled on an underlying substrate such as a printed circuit board or the like.

Figure 2:
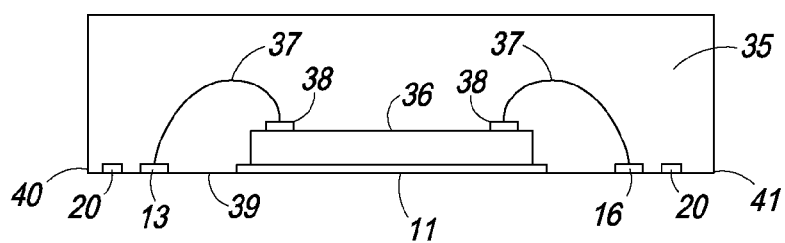
FIG. 2 illustrates an enlarged cross-sectional view of a portion of the package of FIG. 1 in accordance with the present invention.

FIG. 2 illustrates an enlarged cross-sectional view of a portion of package 10 along cross-section line 2-2 in FIG. 1.

Figure 3:
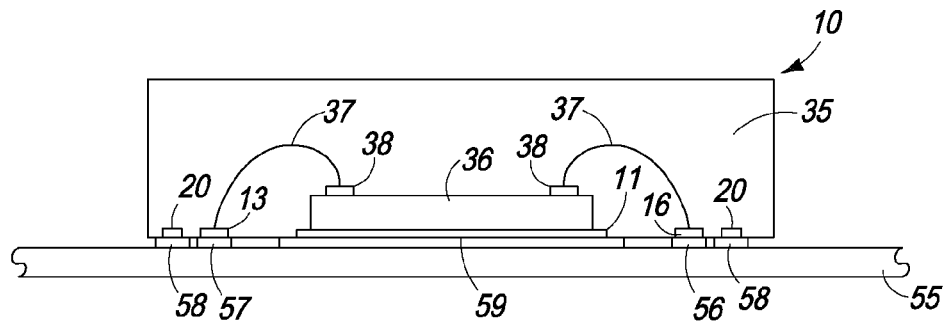
FIG. 3 schematically illustrates an enlarged cross-sectional view of a portion of the package of FIG. 1 assembled onto an exemplary embodiment of an underlying substrate in accordance with the present invention.

FIG. 3 schematically illustrates an enlarged cross-sectional view of a portion of package 10 assembled onto an exemplary embodiment of an underlying substrate 55. Substrate 55 may be a fiberglass epoxy printed circuit (PC) board or the like, a ceramic substrate, a flex-tape type of substrate, other well know type of substrate that is used to attach and interconnect packaged semiconductor devices. This description has references to FIG. 1-FIG. 3.

Package 10 generally includes a package body 35, a die attach area 11, a plurality of interior connection terminals including first connection terminals 12, second connection terminals 13, third connection terminals 14, fourth connection terminals 15, fifth connection terminals 16, and protective barriers or tamper barriers 20. Terminals 12-16 and tamper barriers 20 generally are formed on a major surface of package 10 such as on a bottom surface 39. As illustrated in FIG. 2, a semiconductor die 36 generally is attached to area 11 by techniques that are well known to those skilled in the art. Die 36 usually has connection points such as bonding pads 38 that are formed on die 36 and used to electrically connect die 36 to the terminals of package 10, such as terminals 12-16. Pads 38 are illustrated as being connected to terminals 12-16 by bonding wires 37, however, those skilled in the art will appreciate that other well known connection techniques may also be used. Those skilled in the art will also appreciate that in some embodiments area 11 may be omitted and that in some embodiments, the bottom surface of die 36 may be exposed. Package 10 preferably is a built-up type of semiconductor package such as a BCC or ELGA package. Such packages generally are formed by plating a conductor onto an intermediate substrate, such as a large metal panel, in a pattern that forms a plurality of assembly sites for forming a plurality of semiconductor packages such as package 10. The conductor generally is a multi-layer conductor such as Nickel-palladium-gold (Ni—Pd—Au). Each assembly site optionally includes area 11 and usually includes terminals 12-16 and barriers 20. Thereafter, die 36 may be attached to optional area 11 and generally is electrically connected to terminals 12-16 via bonding wires 37. The assembly is encapsulated. Subsequently, the intermediate substrate usually is removed by techniques such as etching to leave a plurality of packages that are attached together via the encapsulation material. The packages are singulated to form each individual package 10. The techniques used to form such built-up type packages are well known to those skilled in the art.

In some cases, it is desirable to prevent some of the terminals of package 10 from being accessed by an electrical probe that can receive or determine the electrical signals on the terminals. For example, in some applications, such as smart cards, die 36 may have storage elements, such as memory cells, that may contain personal information about a person. It may be desirable to minimize access to some of the terminals of such a package in order to reduce access to the information within such a semiconductor die. Typically, some of the terminals will be critical terminals that should be protected and other terminals may not be critical terminals and may not be protected. For example, it may be desirable to minimize access to any or all of interior terminals 13 or terminals 14 or terminals 15 or terminals 16. As will be seen further hereinafter, tamper barriers 20 are formed and positioned to minimize such access after package 10 is assembled onto an underlying substrate such as substrate 55. In the embodiment illustrated in FIG. 2, terminals 12 are not critical terminals and terminals 13-16 are critical terminals.

Tamper barriers 20 generally are formed between an outside edge of package 10, such as outside edges 40, 41, and 42, and a portion of the connection terminals such as terminals 13. Thus, one of tamper barriers 20 is positioned between terminals 13 and edge 40. Similarly, another tamper barrier 20 is positioned between terminals 16 and edge 41, a third tamper barrier 20 is positioned between terminals 15 and another edge of package 10, and a fourth tamper barrier 20 is positioned between terminals 14 and another edge of package 10. A width 25 and a length 26 of area 11 in addition to width 28 of each of terminals 12-16 and the spacings therebetween are usually formed in accordance with one of the various packaging standards such as JEDEC. A width 31 of barriers 20 is selected to be sufficient to prevent an electrical probe from penetrating through the material used for barrier 20 and the attachment material utilized to attach barrier 20 to an underlying substrate. Width 31 generally varies from about one hundred to two hundred fifty (100-250) microns and preferably is at least about two hundred (200) microns. A length 30 of barriers 20 generally is at least long enough to extend along a length that is no less than the width of the number of terminals that must be protected by barrier 20. Length 30 may be longer than this minimum length. A distance 21 between barriers 20 and terminals 12-16 is selected to minimize access to the critical terminals. Distance 18 generally is formed to provide for distance 21 plus the distance of barriers 20 from the edges of package 10. Even though terminals 12 are not critical terminals for the embodiment illustrated in FIG. 2, barrier 20 extends between terminals 12 and the edges of body 35 in order to ensure that terminals 13-16 are protected.

In one embodiment of a twenty (20) terminal surface mount package with four tamper barriers 20, width 28 was approximately 0.3 mm. In this example embodiment, terminals 13 were critical terminals to be protected by barrier 20. Thus, length 30 was greater than the width of each of terminals 13 plus the inner terminal spacing of terminals 13 and the inner terminal spacing between terminals 12 and 13. Length 30 also extended past terminals 12 which resulted in length 30 being approximately four milli-meters (4 mm). Terminals 14, 15, and 16 were also critical terminals and the corresponding barriers 20 were similarly formed.

After package 10 is assembled onto an underlying substrate, such as substrate 55, as illustrated in the exemplary embodiment in FIG. 3, tamper barriers 20 are mechanically attached to and electrically connected to attachment areas 58 on substrate 55, and connection terminals 12-16 are mechanically attached to and electrically connected to other attachment areas 57 on substrate 55. Since terminals 12-16 are electrically connected to die 36, attachment areas 57 typically are used to electrically connect terminals 12-16 to other connection terminals of other semiconductor packages or to electrically interconnect some of terminals 12-16 together. Optional area 11 may be mechanically and electrically attached to an attachment area 59 on substrate 55. Attachment areas 58 generally are used to mechanically attach tamper barriers 20 to substrate 55. As illustrated in FIG. 3, with tamper barriers 20 mechanically attached to connection areas 58, it would be difficult to insert a probe between package 10 and substrate 55 to make electrical contact to terminals 13-16. It should be noted that terminals 12 assist in preventing a probe from being inserted from an adjacent side or form a corner such as between barriers 20. Additionally, in some embodiments attachment areas 58 may be connected to an electrical potential such as ground or power from substrate 55. Such an electrical connection would electrically interfere with any electrical probe that were attempted to be inserted under package 10 in order to electrically probe terminals 13-16. For example, if barriers 20 were connected to ground, the electrical probe would be grounded. As is well known in the art, substrate 55 may be a multilayer PC board and areas 56 and 57 may connect to an interior layer of the multi-layer PC board in order to form other electrical connections. Although barriers 20 generally are not electrically connected internally within package 10 to die 36, in some embodiments, barriers 20 may be connected to one of a power terminal or a common return terminal of the die 36. Such connections may be made via bonding wires or other well-known means.

Figure 4:
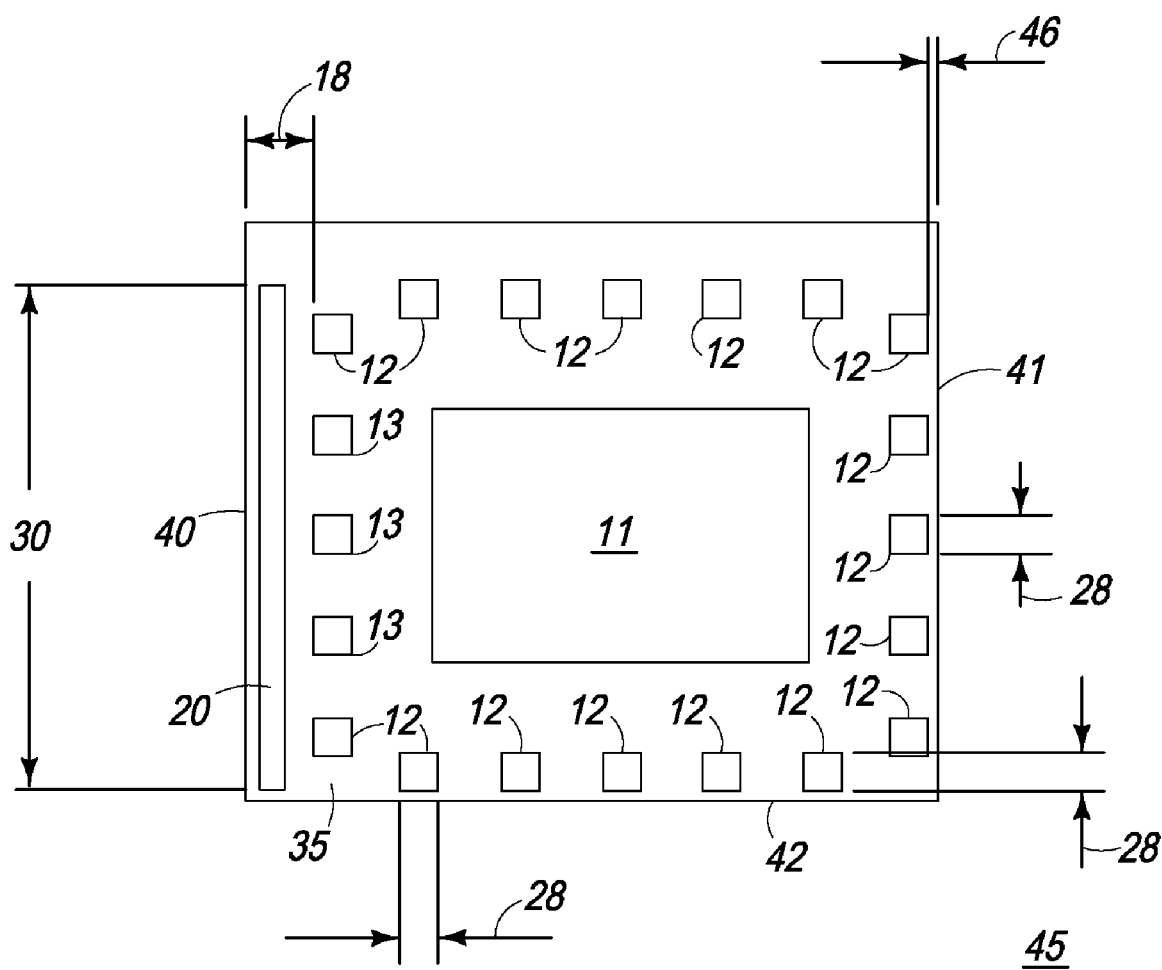
FIG. 4 illustrates an enlarged bottom plan view of a portion of an embodiment of another semiconductor package that is an alternate embodiment of the package of FIG. 1 in accordance with the present invention.

FIG. 4 illustrates an enlarged bottom plan view of a portion of an embodiment of a semiconductor package 45 that is an alternate embodiment of package 10 that was described in the description of FIG. 1-FIG. 3. Package 45 is similar to package 10 except package 45 only has one barrier 20 that is adjacent to edge 40. The length and width of package 10 (FIG. 1) generally had to be large enough so that terminals 12-16 were arranged to be compliant with a packaging standard, such as JEDEC, and also had to be large enough for barriers 20 to be formed between terminals 13-16 and the edges of body 35. In some embodiments, the number of critical terminals that need to be protected may be less than those protected by package 10. For such configurations, the number of barriers 20 may be reduced in order to just protect the critical terminals. For the embodiment of package 45, terminals 13 may be the critical terminals, thus, only one barrier 20 is used. In other embodiments, the critical terminals may be only terminals 14 or terminals 15 or terminals 16 or some combination thereof. For such embodiments, barrier 20 is positioned between the critical terminals and the corresponding edge of body 35. Using fewer barriers than the package has edges, for example four edges and less than four barriers 20, forms barriers 20 to be asymmetrical to the package, such as package 45. The connection terminals, such as terminals 12-16, generally are symmetrical to the center of the package but barriers 20 may not be symmetrical. A distance 46 between terminals 12 and edge 41 generally is less than the distance between terminals 13 and edge 40.

Figure 5:
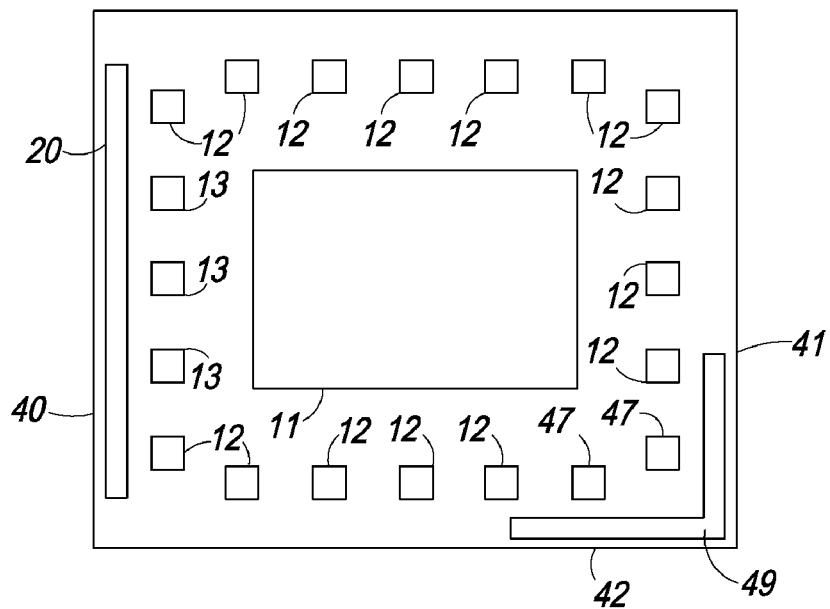
FIG. 5 illustrates an enlarged bottom plan view of a portion of an embodiment of yet another semiconductor package that is an alternate embodiment of the package of FIG. 1 in accordance with the present invention.

FIG. 5 illustrates an enlarged bottom plan view of a portion of an embodiment of a semiconductor package 48 that is an alternate embodiment of package 10 that was described in the description of FIG. 1-FIG. 3 and of package 45 that was described in the description of FIG. 4. Package 48 is similar to package 45 except package 48 has an additional tamper barrier 49 in addition to one barrier 20. Tamper barrier 49 is positioned between terminals 47 that are near a corner of edges 41 and 42. Terminals 47 are similar to terminals 12 of FIG. 1 except that terminals 47 are protected. Terminals 12 in FIG. 5 generally are not protected. Barrier 49 is similar to barrier 20 except that barrier 49 is positioned to protect terminals 47 that are near the corner of edges 41 and 42, thus, barrier 49 is between edges 41 and 42 and the corresponding terminals 47. Those skilled in the art will appreciate that barriers that are similar to barrier 49 may be used at any of the corners of package 48 and also in conjunction with any number of barriers 20.

Figure 6:
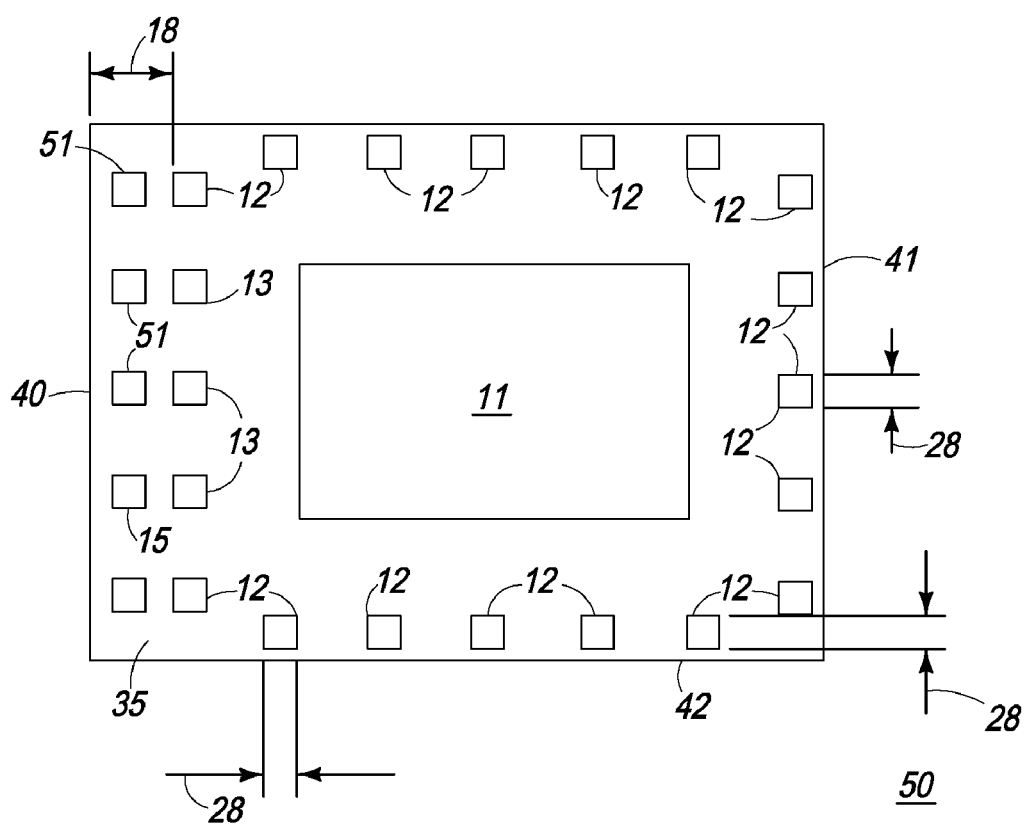
FIG. 6 illustrates an enlarged bottom plan view of a portion of an embodiment of another semiconductor package that is an alternate embodiment of the package of FIG. 1 in accordance with the present invention.

FIG. 6 illustrates an enlarged bottom plan view of a portion of an embodiment of a semiconductor package 50 that is another alternate embodiment of package 10 that was described in the description of FIG. 1-FIG. 3. Package 50 is similar to package 10 except package 50 has individual tamper elements or tamper barriers 51 instead of a single long tamper barrier 20. Tamper barriers 51 are formed as individual elements that are positioned between each critical terminal and the corresponding edge of package 50. For the illustrated example, terminals 13 are the critical terminals that are protected by barriers 51 and terminals 12 may not be protected. Barriers 51 generally are formed in a manner similar to barrier 20 but are spaced into individual elements instead of a long continuous strip. Each of barriers 51 preferably have a width that is at least equal to width 28 of terminals 13 and may be wider than width 28. In some cases, the width may be less than width 28 or may be the same as barrier 20. Similar to barriers 20, barriers 51 generally are not electrically connected to die 36. However, in some embodiments, barriers 51 may be connected to one of a power terminal or a common return terminal of die 36. Such connections may be made via bonding wires. Some of barriers 51 may be interconnected together instead of being connected directly to die 36. Such interconnections may be made as a portion of the process of forming barriers 51 wherein a conductor material is formed between barriers 51 internally to body 35. In other embodiments of package 50, other terminals may be the critical terminals and barriers 51 will be positioned between those terminals and the corresponding edge in a manner similar to barriers 51 relative to terminals 13. Barriers 51 are also asymmetrical to package 50 and the connection terminals, such as terminals 12, generally are symmetrical to the center of package 50.

Figure 7:
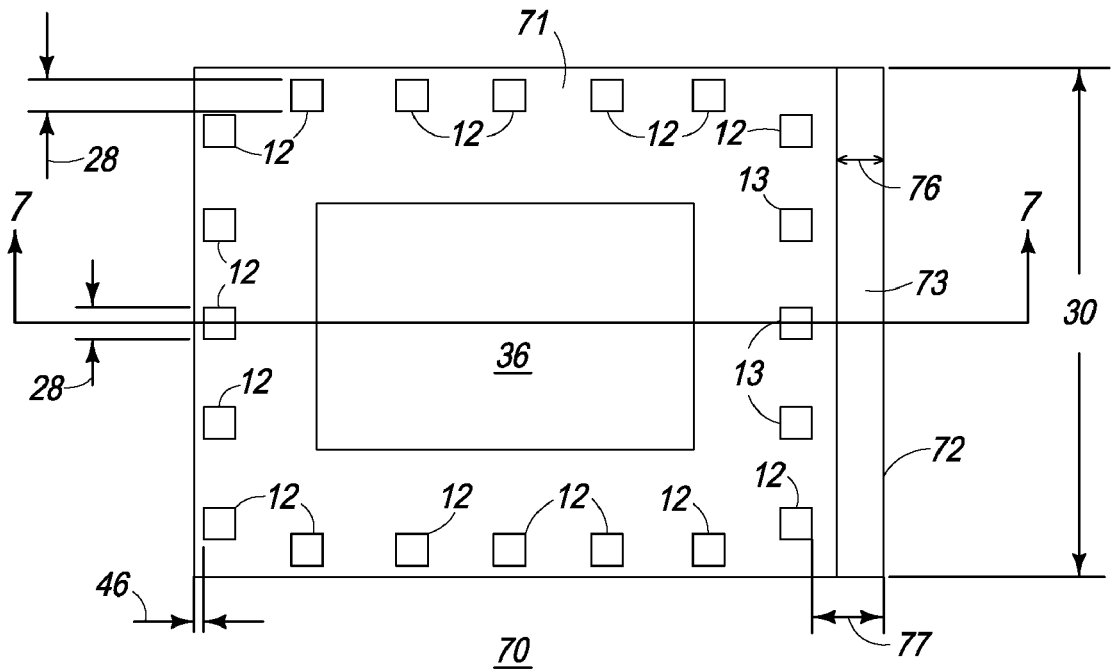
FIG. 7 illustrates an enlarged bottom plan view of a portion of an embodiment of another semiconductor package that is an alternate embodiment of the package of FIG. 1 in accordance with the present invention.

FIG. 7 illustrates an enlarged bottom plan view of a portion of an embodiment of semiconductor package 70.

Figure 8:
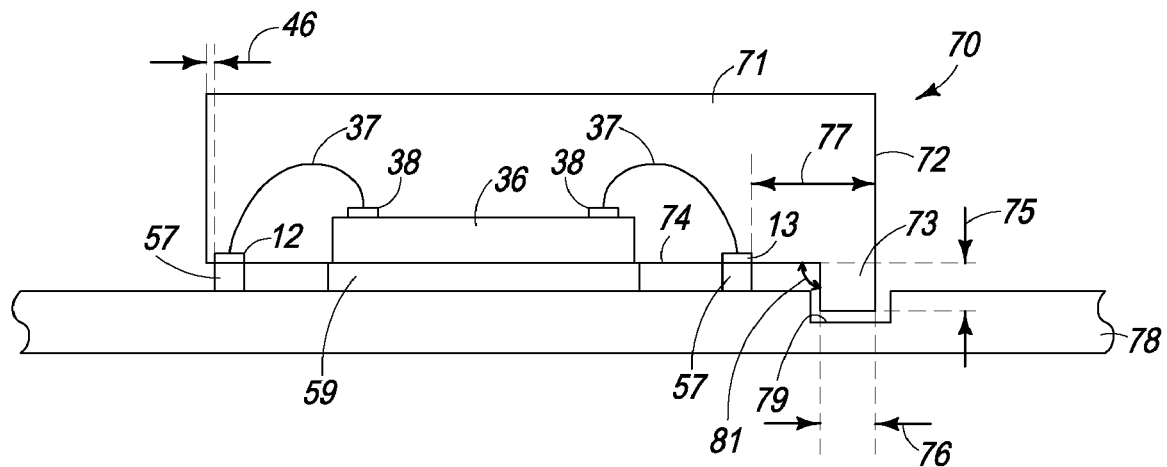
FIG. 8 schematically illustrates an enlarged cross-sectional view of a portion of the package of FIG. 7 assembled onto an exemplary embodiment of an underlying substrate in accordance with the present invention.

FIG. 8 schematically illustrates an enlarged cross-sectional view of a portion of semiconductor package 70 assembled onto an exemplary embodiment of an underlying substrate 78. The cross-sectional view is along cross-section line 7-7 of FIG. 7. This description has references to FIGS. 7 and 8. Package 70 is an alternate embodiment of package 10 that was described in the description of FIG. 1-FIG. 3 and of package 45 that was described in the description of FIG. 4. Package 70 is similar to packages 10 and 45 except package 70 has a tamper barrier 73. Package 70 has a package body 71 that is formed to encapsulate die 36, bonding wires 37, and connection terminals 12 and 13. A portion of body 71 along an outside edge 72 of package 70 extends a distance 75 past a bottom surface 74 of package 70 to form tamper barrier 73. In the preferred embodiment, barrier 73 extends substantially perpendicular to bottom surface 74 as illustrated by an arrow 81. Barrier 73 may extend at other angles 81 in other embodiments. For example, angle 81 may be an acute angle so that body 71 overlies barrier 73 or angle 81 may be obtuse so that at least a portion of barrier 73 may not underlie body 71. Barrier 73 has a width 76 that extends along bottom surface 74 between the terminals to be protected, such as terminals 13, and edge 72. Length 30 of barrier 73 usually extends along the entire edge 72 of package 70 in order to protect terminals 13. In some embodiments, length 30 may be less than the length of edge 72 as long as it is sufficient to protect terminals 13. Substrate 78 has an opening 79 in the top surface of substrate 78 so that tamper barrier 73 fits into opening 79. Opening 79 may be a recess in the surface of substrate 78 or may be an opening through substrate 78. A distance 77 from terminals 13 to edge 72 usually is greater than distance 46 between terminals 12 and the corresponding side of package 70.

Tamper barrier 73 protects terminals 13 from being probed after package 70 is attached to substrate 78. Terminals 12 generally are not protected by barrier 73. Tamper barrier 73 generally is asymmetrical to body 71. However, those skilled in the art will appreciate that package 70 could have other tamper barriers such as barrier 73 along other edges of package 70 or may have other tamper barriers such as barrier 20 along other edges of package 70.

Barrier 73 usually is formed during the process of forming body 71. For example, for a molded body 71 the mold may have a recess to allow some of the encapsulation material used for forming body 71 to extend past bottom surface 74 and form barrier 73.

In view of all of the above, it is evident that a novel device and method is disclosed. Included, among other features, is forming a tamper barrier or protective barrier between connection terminals of a semiconductor package and an edge of the semiconductor package. The protective barrier minimizes electrical access to the connection terminals via an electrical probe or other device after the semiconductor package is assembled onto an underlying substrate.

While the subject matter of the invention is described with specific embodiments, it is evident that many alternatives and variations will be apparent to those skilled in the semiconductor arts. The tamper barriers may be positioned at any position on the package as necessary to protect some of the connection terminals of the semiconductor package.

The invention claimed is:

1. A method of forming a semiconductor package comprising:
    forming a die attach area on an intermediate substrate;
    forming a first plurality of connection terminals on the intermediate substrate;
    forming a tamper barrier on the intermediate substrate wherein the first plurality of connection terminals is between the tamper barrier and the die attach area;
    attaching a semiconductor die to the die attach area and electrically connecting connection points on the semiconductor die to the first plurality of connection terminals;
    encapsulating the semiconductor die and at least a portion of surfaces of both the first plurality of connection terminals and the tamper barrier wherein the tamper barrier is positioned between an edge of the semiconductor package and the first plurality of connection terminals and wherein a length of the tamper barrier is greater than a total width of all of the plurality of connection terminals plus an inner terminal spacing of the plurality of connection terminals; and removing the intermediate substrate.

2. The method of claim 1 wherein attaching the semiconductor die to the die attach area and electrically connecting connection points on the semiconductor die includes not electrically connecting the tamper barrier to the semiconductor die.

3. The method of claim 1 wherein forming the tamper barrier includes forming a conductor extending adjacent to the edge of the semiconductor package.

4. The method of claim 1 wherein forming the tamper barrier includes forming the first plurality of connection terminals symmetrically to a center of the semiconductor package and forming the tamper barrier asymmetrically to the center of the semiconductor package.

5. A method of forming a semiconductor package comprising:

forming a plurality of connection terminals on a first major surface of the semiconductor package wherein the plurality of connection terminals are positioned symmetrically to a center of the first major surface; and forming a tamper barrier to extend continuously between the plurality of connection terminals and a first edge of the semiconductor package wherein the tamper barrier is asymmetrical to the semiconductor package.

6. The method of claim 5 wherein forming the tamper barrier includes forming the tamper barrier adjacent to an edge of the first major surface.

7. The method of claim 5 wherein forming the tamper barrier adjacent to the first edge of the semiconductor package includes forming of the tamper barrier as a portion of the semiconductor package that extends at an angle a first distance away from the first major surface wherein the first distance is greater than a distance that any of the plurality of connections terminals extend from the first major surface.

8. The method of claim 5 wherein forming the tamper barrier includes forming the tamper barrier with a length that is greater than a width of the plurality of connection terminals plus the inner terminal spacing of the plurality of connection terminals.

9. The method of claim 5 wherein forming the tamper barrier includes forming a conductor as the tamper barrier.

10. A method of forming a semiconductor package comprising:

forming a plurality of connection terminals on a first major surface of the semiconductor package wherein at least a portion of the plurality of connection terminals are electrically connected to a semiconductor die within the semiconductor package; and forming a tamper barrier between at least a portion of the plurality of connection terminals and a first edge of the semiconductor package wherein the tamper barrier extends at a first angle a first distance away from the first major surface wherein the first distance is greater than a distance that any of the plurality of connection terminals extends away from the first major surface.

11. The method of claim 10 including forming the tamper barrier as a portion of an encapsulation material used for forming a body of the semiconductor package and wherein the first angle is one of an acute angle, a perpendicular angle, or an obtuse angle.

12. The method of claim 1 wherein forming the tamper barrier includes positioning the tamper barrier no greater than approximately 0.1 mm from the first plurality of connection terminals.

13. The method of claim 10 wherein forming the tamper barrier includes positioning the tamper barrier no greater than approximately 0.06 mm from the first plurality of connection terminals.

14. The method of claim 1 wherein forming the tamper barrier includes positioning the tamper barrier no greater than approximately 0.05 to 0.06 mm from the first plurality of connection terminals.

\* \* \* \* \*

UNITED STATES PATENT AND TRADEMARK OFFICE
CERTIFICATE OF CORRECTION

| | | |
|---|---|---|
| PATENT NO. | : 7,638,863 B2 | Page 1 of 1 |
| APPLICATION NO. | : 11/469239 | |
| DATED | : December 29, 2009 | |
| INVENTOR(S) | : Celaya et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 644 days.

Signed and Sealed this

Ninth Day of November, 2010

David J. Kappos
*Director of the United States Patent and Trademark Office*